United States Patent
Matsumoto et al.

(10) Patent No.: US 9,230,776 B2
(45) Date of Patent: Jan. 5, 2016

(54) ION IRRADIATION APPARATUS AND ION IRRADIATION METHOD

(71) Applicant: NISSIN ION EQUIPMENT CO., LTD., Kyoto-shi, Kyoto (JP)

(72) Inventors: Takeshi Matsumoto, Kyoto (JP); Koichi Orihira, Kyoto (JP); Masatoshi Onoda, Kyoto (JP)

(73) Assignee: NISSIN ION EQUIPMENT CO., LTD., Kyoto (JP)

( * ) Notice: Subject to any disclaimer, the term of this patent is extended or adjusted under 35 U.S.C. 154(b) by 0 days.

(21) Appl. No.: 14/596,311

(22) Filed: Jan. 14, 2015

(65) Prior Publication Data

US 2015/0262790 A1 Sep. 17, 2015

(30) Foreign Application Priority Data

Mar. 12, 2014 (JP) .................................. 2014-048576

(51) Int. Cl.
*H01J 37/317* (2006.01)
*H01J 37/30* (2006.01)
*H01J 37/244* (2006.01)
*H01J 37/20* (2006.01)

(52) U.S. Cl.
CPC ............. *H01J 37/3171* (2013.01); *H01J 37/20* (2013.01); *H01J 37/244* (2013.01); *H01J 37/3007* (2013.01); *H01J 2237/31703* (2013.01)

(58) Field of Classification Search
USPC ................ 250/340, 341.1, 336.1, 395, 492.1, 250/492.2, 492.21, 492.3
See application file for complete search history.

(56) References Cited

U.S. PATENT DOCUMENTS

| 7,265,368 | B2 * | 9/2007 | Martin, III | H01J 49/06 250/281 |
| 2002/0184275 | A1 * | 12/2002 | Dutta | H03H 17/0294 708/300 |
| 2006/0255294 | A1 * | 11/2006 | Martin, III | H01J 49/06 250/492.3 |
| 2007/0114456 | A1 | 5/2007 | Yasuda | |
| 2009/0230930 | A1 * | 9/2009 | Jain | H02M 3/1588 323/234 |
| 2010/0207039 | A1 * | 8/2010 | Ulcinas | B82Y 20/00 250/492.1 |

* cited by examiner

Primary Examiner — Bernard E Souw
(74) Attorney, Agent, or Firm — Sughrue Mion, PLLC

(57) ABSTRACT

An ion irradiation apparatus is provided. The ion irradiation apparatus includes a support member, a measuring device, and a control device. The support member is larger than the substrate. The measuring device is disposed forwardly in a traveling direction of an ion beam. The ion irradiation apparatus operates in a first mode during which the measuring device is irradiated with a remaining part of the ion beam after being partially shielded by the support member, when the substrate is not irradiated with the ion beam after crossing the ion beam; and a second mode during which the measuring device is irradiated with the ion beam without being shielded by the support member, when the substrate is not irradiated with the ion beam after crossing the ion beam. The control device controls the substrate so that the ion treatment process is performed in the first mode at least one time during the treatment.

11 Claims, 8 Drawing Sheets

ION IRRADIATION APPARATUS AND ION IRRADIATION METHOD

BACKGROUND

1. Field

The present disclosure relates to an ion irradiation apparatus for irradiating a substrate (a wafer, a glass plate or the like) with an ion beam to subject the substrate to an ion irradiation treatment, and an ion irradiation method using the ion irradiation apparatus.

2. Description of the Related Art

An ion implantation apparatus is known as one type of ion irradiation apparatus. The ion implantation apparatus includes one type configured to reciprocatingly convey a substrate in such a manner as to cause the substrate to intersect an ion beam to thereby subject the substrate to an ion implantation treatment, where a beam current is measured during the treatment of the substrate, and, when a fluctuation in the beam current occurs, various parameters of the ion implantation apparatus are adjusted so as to prevent an influence on a subsequent ion implantation treatment.

This type of ion implantation apparatus is configured to reciprocatingly convey a wafer in such a manner as to cause the wafer to intersect an ion beam to thereby subject the entire surface of the wafer to an ion implantation treatment, wherein a dose Faraday cup is disposed forwardly in a traveling direction of the ion beam with respect to a position where the wafer is conveyed within an end-station, and at a position irradiated with the ion beam. In this configuration, when the wafer is conveyed to a position non-irradiated with the ion beam, a beam current of the ion beam irradiating the wafer is measured by the dose Faraday cup. As a result of the beam current measurement, if the beam current has a fluctuation which hinders the uniform formation of a dose distribution in a plane of the wafer, a conveyance speed of the wafer is changed during subsequent conveyance in such a manner as to allow the dose distribution to become uniform.

Depending on a content of the ion implantation treatment, the number of substrate conveyance strokes can be increased. For example, in the case where an amount of ions to be implanted into a substrate (a wafer made of silicon or the like, or glass plate) is relatively large, and in the case where the substrate is subjected to an ion implantation treatment intentionally using an ion beam having a relatively small beam current with a view to suppressing outgassing from the substrate, the number of substrate conveyance strokes is increased.

As the number of substrate conveyance strokes is increased, a time required for an ion implantation treatment of a substrate becomes longer. The type of ion implantation apparatus described above is configured to measure a beam current of an ion beam irradiating the wafer, in each conveyance stroke of the wafer. Thus, the number of measurements is increased along with an increase in the number of conveyance strokes, and thereby a time required for the ion implantation treatment becomes much longer.

SUMMARY

It is an aspect to shorten a total time for an ion implantation treatment of a substrate, while checking a state of an ion beam irradiating the substrate during the ion implantation treatment.

According to an aspect of one or more exemplary embodiments, there is provided an ion irradiation device that comprises a support member having an outside dimension greater than an outside dimension of a substrate in a conveyance direction of the substrate, the support member being configured to be conveyed together with the substrate while supporting the substrate by an inward region of the support member in the conveyance direction; and a measuring device disposed forwardly in a traveling direction of an ion beam with respect to a position where the substrate is conveyed within a treatment chamber, the measuring device being configured to be irradiated with at least a part of the ion beam, when the substrate is at a position in which the substrate is not irradiated with the ion beam, wherein the ion irradiation apparatus is configured to perform an ion irradiation treatment process of conveying the substrate within the treatment chamber in a direction intersecting the ion beam traveling direction so that the substrate is irradiated with the ion beam, a plurality of times, to complete an ion irradiation treatment for the substrate, wherein the ion irradiation treatment process comprises a first ion irradiation treatment mode during which the measuring device is irradiated with a remaining part of the ion beam after being partially shielded by the support member, when the substrate is disposed at the position in which the substrate is not irradiated with the ion beam after crossing the ion beam; and a second ion irradiation treatment mode during which the measuring device is irradiated with the ion beam without being shielded by the support member, when the substrate is disposed at the position in which the substrate is not irradiated with the ion beam after crossing the ion beam, and wherein the ion irradiation apparatus further comprises a control device configured to control the conveyance of the substrate in such a manner that the ion irradiation treatment process is performed in the first ion irradiation treatment mode at least one time during a period until the ion irradiation treatment for the substrate is completed.

According to another aspect of one or more exemplary embodiments, there is provided an ion irradiation method that comprises providing a support member having an outside dimension greater than an outside dimension of a substrate in a conveyance direction of the substrate, and a measuring device disposed forwardly in a traveling direction of an ion beam with respect to a position where the substrate is conveyed within a treatment chamber, wherein the support member is configured to be conveyed together with the substrate while supporting the substrate by an inward region of the support member in the conveyance direction, and the measuring device is configured to be irradiated with at least a part of the ion beam, when the substrate is at a position at which the substrate is not irradiated with the ion beam; performing an ion irradiation treatment process of conveying the substrate within the treatment chamber in a direction intersecting the ion beam traveling direction to irradiate the substrate with the ion beam, a plurality of times, to complete an ion irradiation treatment for the substrate, wherein the ion irradiation treatment process comprises a first ion irradiation treatment mode during which the measuring device is irradiated with a remaining part of the ion beam after being partially shielded by the support member, when the substrate is disposed at the position at which the substrate is not irradiated with the ion beam after crossing the ion beam; and a second ion irradiation treatment mode during which the measuring device is irradiated with the ion beam without being shielded by the support member, when the substrate is disposed at the position at which the substrate is not irradiated with the ion beam after crossing the ion beam; and conveying the substrate in such a manner that the ion irradiation treatment process is performed in the first ion irradiation treatment mode at least one time during a period until the ion irradiation treatment for the substrate is completed.

According to yet another aspect of one or more exemplary embodiments, there is provided an ion irradiation apparatus that comprises a support member having a substrate mounted thereon, an area of the support member in a plane orthogonal to a traveling direction of an ion beam being greater than an area of the substrate in the plane orthogonal to the traveling direction; a measuring device that is disposed downstream of the support member in the traveling direction and that measures the ion beam; and a control device configured to convey the support member in a direction intersecting the traveling direction to irradiate the substrate with the ion beam a plurality of times to perform an ion irradiation treatment on the substrate, wherein the control device is configured to convey the support member, after crossing the ion beam, to a first position in which the substrate is not irradiated with the ion beam but the support member partially shields the measuring device from the ion beam, and to a second position in which the support member and the substrate are not irradiated by the ion beam and do not shield the measuring device from the ion beam, and wherein the control device conveys the support member to the first position at least one time during the ion irradiation treatment.

BRIEF DESCRIPTION OF THE DRAWINGS

FIGS. 3A and 3B illustrate two modes of an ion implantation treatment process, respectively, wherein FIG. 3A is an explanatory diagram of a first ion implantation treatment mode, and FIG. 3B is an explanatory diagram of a second ion implantation treatment mode, according to an exemplary embodiment;

DESCRIPTION OF EXEMPLARY EMBODIMENTS

Figure 1:
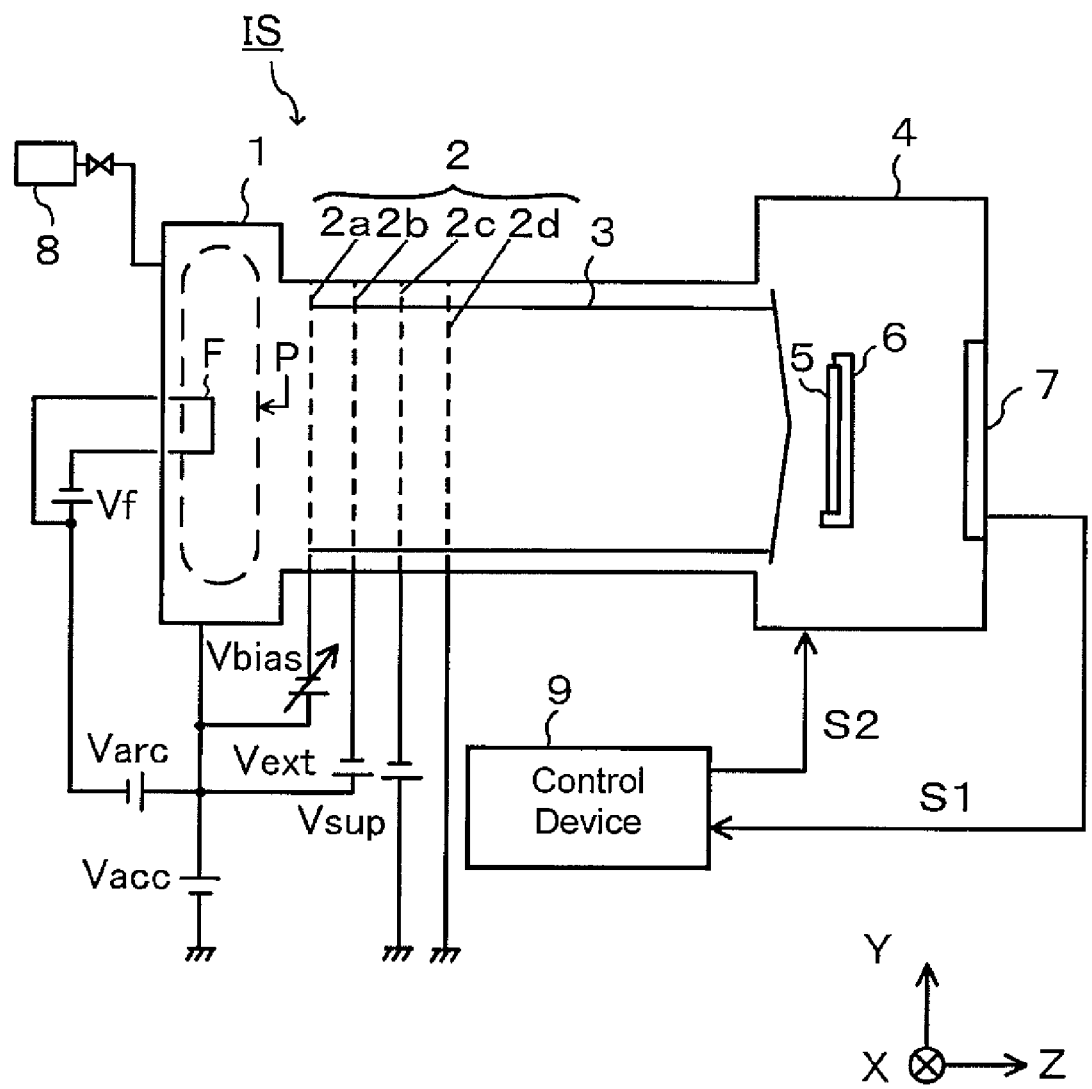
FIG. 1 is a schematic diagram illustrating a configuration of an ion implantation apparatus according to an exemplary embodiment.
Figure 2:
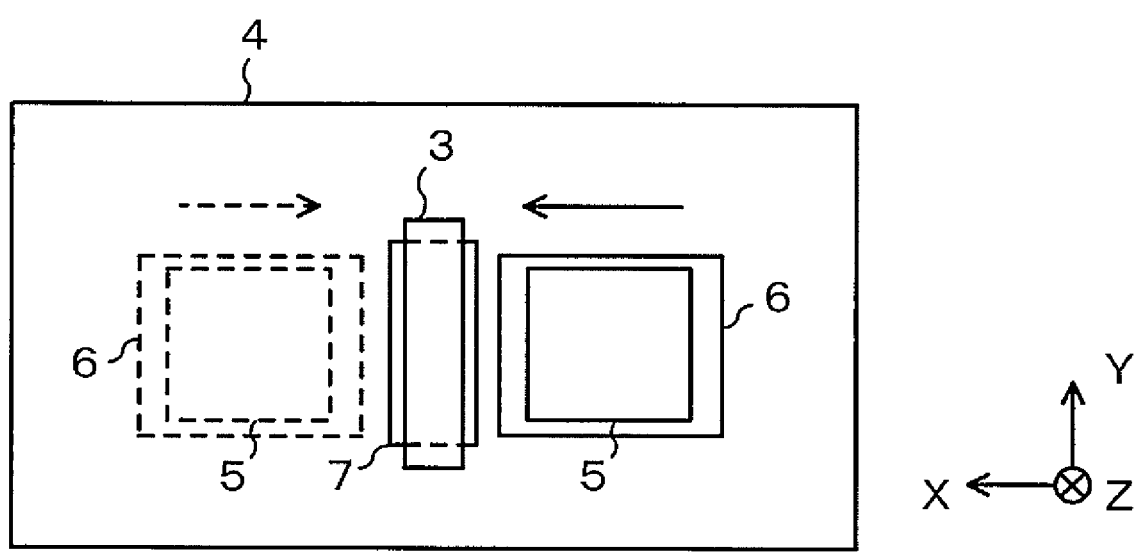
FIG. 2 is an explanatory diagram of conveyance of a substrate, according to an exemplary embodiment.

With reference to FIGS. 1 and 2, exemplary embodiments will now be described by taking an ion implantation apparatus as an example of an ion irradiation apparatus.

FIG. 1 is a schematic diagram illustrating a configuration of an ion implantation apparatus according to an exemplary embodiment. The configuration of this ion implantation apparatus will be briefly described. In FIGS. 1 and 2, the illustrated X-, Y- and Z-axis directions are orthogonal to each other. This relationship also applies to the remaining figures.

As shown in FIG. 1, a plasma generation container 1 is a rectangular parallelepiped-shaped container having a Y-axis directional dimension greater than an X-axis directional dimension, and a process gas (e.g., $BF_3$ or $PH_3$) is supplied from a gas cylinder 8 into the plasma generation container 1. The plasma generation container 1 has a potential fixed to a given value by an acceleration power supply Vacc. A filament F is installed within the plasma generation container 1, and an arc power supply Varc is connected between the filament F and the plasma generation container 1.

A filament power supply Vf is connected to opposite ends of the filament F, and configured to heat the filament F to cause thermal electrons to be released from the filament F. The thermal electrons collide with the process gas supplied from the gas cylinder 8, and thereby the process gas is ionized to generate plasma P.

The plasma generation container 1 has a sidewall that extends in the Z-axis direction and that is formed with an opening, and an extraction electrode system 2 for extracting a ribbon-shaped ion beam 3 that has a Y-axis directional dimension greater than an X-axis directional dimension, in a cross-section of the ion beam in the illustrated X-Y plane, from the plasma P is disposed in adjacent relation to the opening. The extraction electrode system 2 includes a plurality of electrodes, e.g., four electrodes in the exemplary embodiment illustrated in FIG. 1. Specifically, an acceleration electrode 2a, an extraction electrode 2b, a suppression electrode 2c, and a ground electrode 2d are arranged in this order from the side of the plasma generation container 1. These electrodes are electrically isolated from each other. Each of the electrodes is formed with a plurality of circular holes or one or more slits for allowing the ion beam 3 to pass therethrough.

In some exemplary embodiments, a bias power supply Vbias is connected between the acceleration electrode 2a and the plasma generation container 1, and configured to apply an appropriate voltage therebetween depending on a type of process gas so as to increase a rate of specific ion species to be contained in the ion beam 3 extracted through the extraction electrode system 2. The ground electrode 2d is electrically grounded, and a suppression power supply Vsup is connected to the suppression electrode 2c to apply a negative voltage to the suppression electrode 2c. An extraction power supply Vext is connected to the extraction electrode 2b to apply a negative voltage to the extraction electrode 2b on the basis of the plasma generation container 1 in order to extract the ion beam 3 having a positive charge, from the extraction electrode system 2.

The ion beam 3 extracted through the extraction electrode system 2 is emitted to an inside of a treatment chamber 4, after traveling in the Z-axis direction. The ion beam 3 emitted to the treatment chamber 4 has an outer shape which is greater than a Y-axis directional dimension of a substrate 5 disposed in the treatment chamber 4, and less than an X-axis directional dimension of the substrate 5. The substrate 5 is reciprocatingly conveyed in the X-axis direction by a non-illustrated drive mechanism, while being supported within the treatment chamber 4 by a support member 6. According to the reciprocating conveyance, the entire surface of the substrate 5 is irradiated with the ion beam 3.

Although the ion beam 3 has been described above as a ribbon-shaped ion beam elongated in Y-axis direction, this is only an example and the ion beam is not limited to such a ribbon-shaped ion beam. For example, in some exemplary embodiments, the ion implantation apparatus may be configured to extract a spot-shaped ion beam from the extraction electrode system 2 and scan the extracted spot-shaped ion beam in the Y-axis direction by a magnetic field or an electric field. In this case, the entire surface of the substrate 5 can be irradiated even with the spot-shaped ion beam by reciprocatingly conveying the substrate 5 in the X-axis direction, as with the ribbon-shaped ion beam.

Although an arc discharge-type ion source IS is illustrated in FIG. 1, this is only an example, and in some exemplary embodiments, the ion source IS may be a high frequency-type ion source. Further, in some exemplary embodiments, a mass analysis electromagnet may be disposed in a path from the ion source IS to the treatment chamber 4 to sort a specific ion from various ions contained in the ion beam 3 by mass analysis.

A measuring device 7 is disposed in the treatment chamber 4 at a position irradiated with the ion beam 3. The measuring device 7 includes, for example, a plurality of Faraday cups disposed along the Y-axis direction. A control device 9 has a function of controlling the unillustrated drive mechanism and controlling the conveyance of the substrate 5. As depicted for example in FIG. 1, the control device 9 is operable to receive a result of the measurement by the measuring device 7, in the form of a signal S1, and transmit to the drive mechanism a control signal S2 for controlling the conveyance of the substrate 5 based on the signal S1. In this way, the control device 9 is operable to control a position of the substrate 5 to be conveyed by the drive mechanism to thereby switch between aftermentioned first and second ion implantation treatment modes.

FIG. 2 depicts a state of the inside of the treatment chamber 4 when viewed in the Z-axis direction. The substrate 5 is conveyed along a direction of the arrowed line indicated by the solid line, i.e., a direction from a right side toward a left side in FIG. 2, by the unillustrated drive mechanism, while being supported by the support member 6. The substrate 5 comes across the ion beam 3 during the conveyance, so that the entire surface of the substrate 5 is irradiated with the ion beam 3. When the substrate 5 is conveyed to the left position indicated by the broken line in FIG. 2, the substrate 5 is then conveyed in a direction from the left side toward the right side in FIG. 2, by the unillustrated drive mechanism. In some exemplary embodiments, an ion implantation treatment process of conveying the substrate 5 within the treatment chamber 4 in the direction from the left side to the right side or the direction from the right side to the left side while coming across the ion beam 3 is performed plural times, during a period until the ion implantation treatment for the substrate 5 is completed.

When the substrate 5 is not irradiated with the ion beam 3, i.e., when the substrate 5 is at a position non-irradiated with the ion beam 3, the measuring device 7 is irradiated with the ion beam 3, as depicted in FIG. 2. Thus, during the ion implantation treatment for the substrate 5, a state of the ion beam 3 (specifically, a beam current, a shape thereof, etc.) irradiating the substrate 5 can be checked.

Figure 3A:
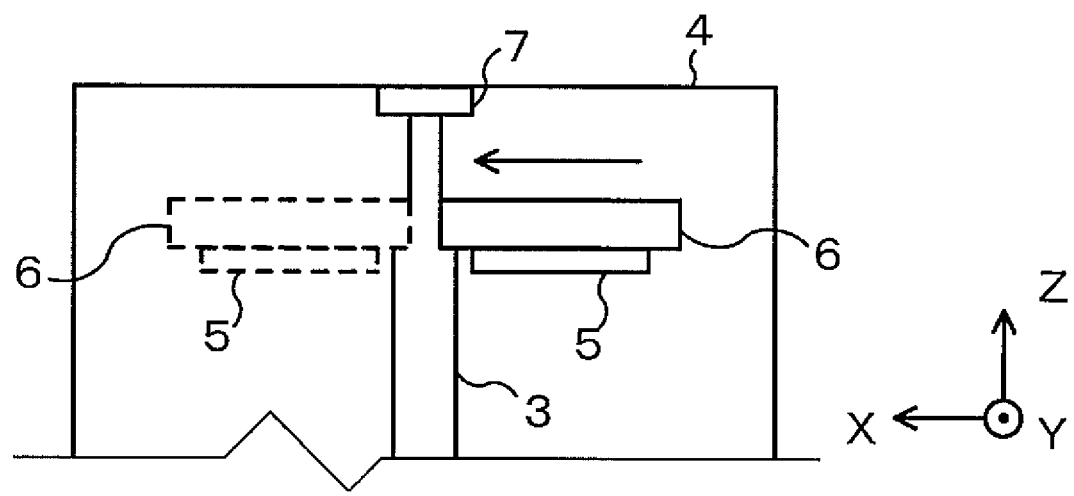
Figure 3B:
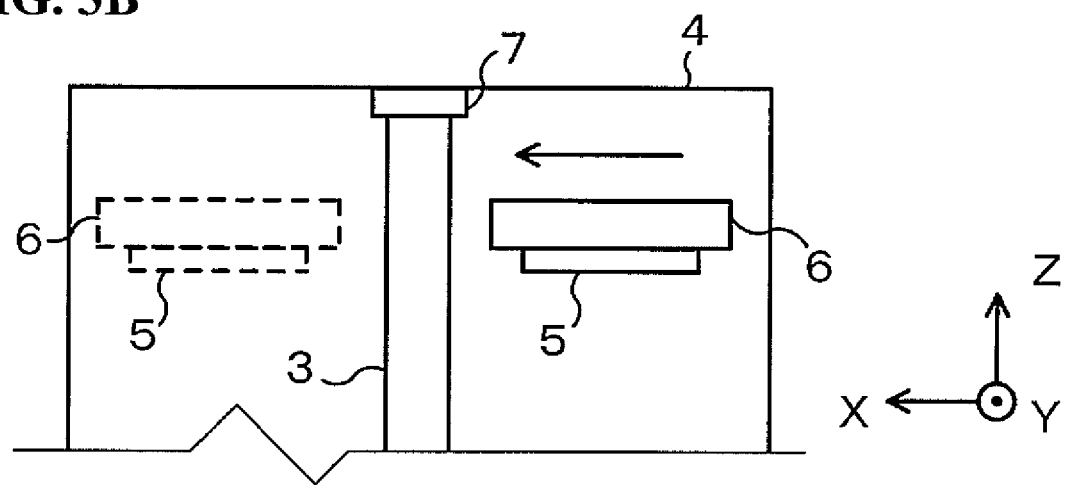

In some exemplary embodiments, the ion implantation treatment process has two types of modes. The ion implantation treatment for the substrate 5 is performed in combination of the two ion implantation treatment modes. Each of the ion implantation treatment modes will be described based on FIG. 3. FIG. 3 depicts a state of the treatment chamber 4 when viewed from thereabove (in a direction opposite to the Y-axis direction in FIG. 1). FIG. 3(A) is an explanatory diagram of a first ion implantation treatment mode, and FIG. 3(B) is an explanatory diagram of a second ion implantation treatment mode, according to an exemplary embodiment. A difference between the two types of ion implantation treatment modes is in conveyance position of the substrate 5. Thus, in the first ion implantation treatment mode, the support member 6 is at a first position, and in the second ion implantation treatment mode, the support member 6 is at a second position.

FIGS. 3A and 3B depict the substrate 5 being conveyed from a right side toward a left side of the ion beam 3. The support member 6 supports the substrate 5 by an inward region thereof in a conveyance direction of the substrate 5. In other words, in the conveyance direction of the substrate 5, the support member 6 has a dimension greater than a dimension of the substrate 5.

In each ion implantation treatment process, during a period until the substrate 5 is conveyed from the right position indicated by the solid line to the left position indicated by the broken line, the substrate 5 is disposed at a position irradiated with the ion beam 3 and at a position failing to be irradiated with the ion beam 3. In FIGS. 3A and 3B, when the substrate 5 is disposed at the positions indicated by the solid and broken lines, the substrate 5 is not irradiated with the ion beam 3. Such a position is referred to as "position non-irradiated with the ion beam 3". On the other hand, when the substrate 5 is disposed at a position overlapping the ion beam 3, the substrate 5 is irradiated with the ion beam 3.

In the first ion implantation treatment mode depicted in FIG. 3A, when the substrate 5 is disposed at the position non-irradiated with the ion beam 3, the measuring device 7 is irradiated with a remaining part of the ion beam 3 after being partially shielded by the support member 6 supporting the substrate 5. On the other hand, in the second ion implantation treatment mode depicted in FIG. 3B, when the substrate 5 is disposed at the position non-irradiated with the ion beam 3, the measuring device 7 is irradiated with the ion beam 5 without being shielded by the support member 6.

During generation of an electrical discharge and during start-up of the apparatus, a beam current of the ion beam 3 largely fluctuates on a short-term basis. On the other hand, in the case where a fluctuation in the beam current is caused by wear of a member such as the filament F for generating the plasma P serving as a source of the ion beam 3, it occurs only on a long-term basis. Considering the above, in some exemplary embodiments, the ion implantation apparatus is configured to perform the ion implantation process, plural times, during a period until the ion implantation treatment for the substrate 5 is completed, wherein the ion implantation treatment process is performed in the first ion implantation treatment mode at least one time.

As compared to the second ion implantation treatment mode, the first ion implantation treatment mode is shorter in terms of a conveying distance of the substrate 5, so that a time for the ion implantation treatment process becomes shorter. In some exemplary embodiments, the ion implantation treatment process is performed in the first ion implantation treatment mode at least one time, so that it becomes possible to shorten a total time for the ion implantation treatment, as compared to a related art ion implantation apparatus in which the ion implantation treatment process is performed only in the second ion implantation treatment mode each time. In some exemplary embodiments, the ion implantation apparatus is also configured such that, during each ion implantation treatment process, the measuring device 7 is irradiated with at least a part of the ion beam. Thus, it becomes possible to always check the state of the ion beam during the ion implantation treatment.

The first ion implantation treatment mode and the second ion implantation treatment mode may be switchably selected depending on a fluctuation in beam current of the ion beam 3. In some exemplary embodiments, the measuring device 7 is used to detect the fluctuation in the beam current. In such a case, the measuring device 7 is irradiated with at least a part of the ion beam 3 during each ion implantation treatment process, so that the fluctuation in the beam current can be detected by measuring the at least a part of the ion beam 3.

In some exemplary embodiments, the switching between the first and second ion implantation treatment modes depending on a fluctuation in the beam current may be specifically performed in the following manner. When a large fluctuation occurs in beam current of the ion beam 3 for use in the implantation treatment, an error is likely to occur in a subsequent ion implantation treatment process. Therefore, the ion implantation apparatus is configured such that, when the beam current largely fluctuates, a subsequent ion implantation treatment process is performed in the second ion implantation treatment mode. This configuration makes it possible to accurately figure out a current state of the ion beam 3 and perform an appropriate correction in a subsequent ion implantation treatment process.

On the other hand, if almost no fluctuation occurs in beam current of the ion beam 3, it is not necessary to accurately figure out the state of the ion beam 3 irradiating the substrate 5. Thus, in this situation, a subsequent ion implantation treatment process may be performed in the first ion implantation treatment mode. Determination as to whether a fluctuation occurs in the beam current may be performed in the following manner. A reference value, such as a beam current value measured in a previous ion implantation treatment process, a beam current value preliminarily obtained by experiment or the like, or a beam current value measured just before start of the ion implantation treatment, is set, and whether there is a fluctuation in the beam current is determined based on a difference between the reference value and an actually measured beam current value.

The measuring device 7 has been described as a device to detects the fluctuation in the beam current. However, this is only an example, and in some exemplary embodiments, a different device may be used. Moreover, it has been described above to switch based on a fluctuation in the beam current. However, this is only an example, and in some exemplary embodiments, the switching between the first and second ion implantation treatment modes may be performed depending on a density of plasma. Specifically, an arc current flowing through the arc power supply Varc may be monitored while comparing a monitored arc current value with a reference value, and, when a difference between the monitored value and the reference value becomes large, a subsequent ion implantation treatment process is performed in the second ion implantation treatment mode.

Alternatively, instead of the arc current, a beam current of the ion beam 3 to be extracted through the extraction electrode system 2 may be derived by calculation, to switch between the first and second ion implantation treatment modes, based on a result of the calculation.

Figure 4:
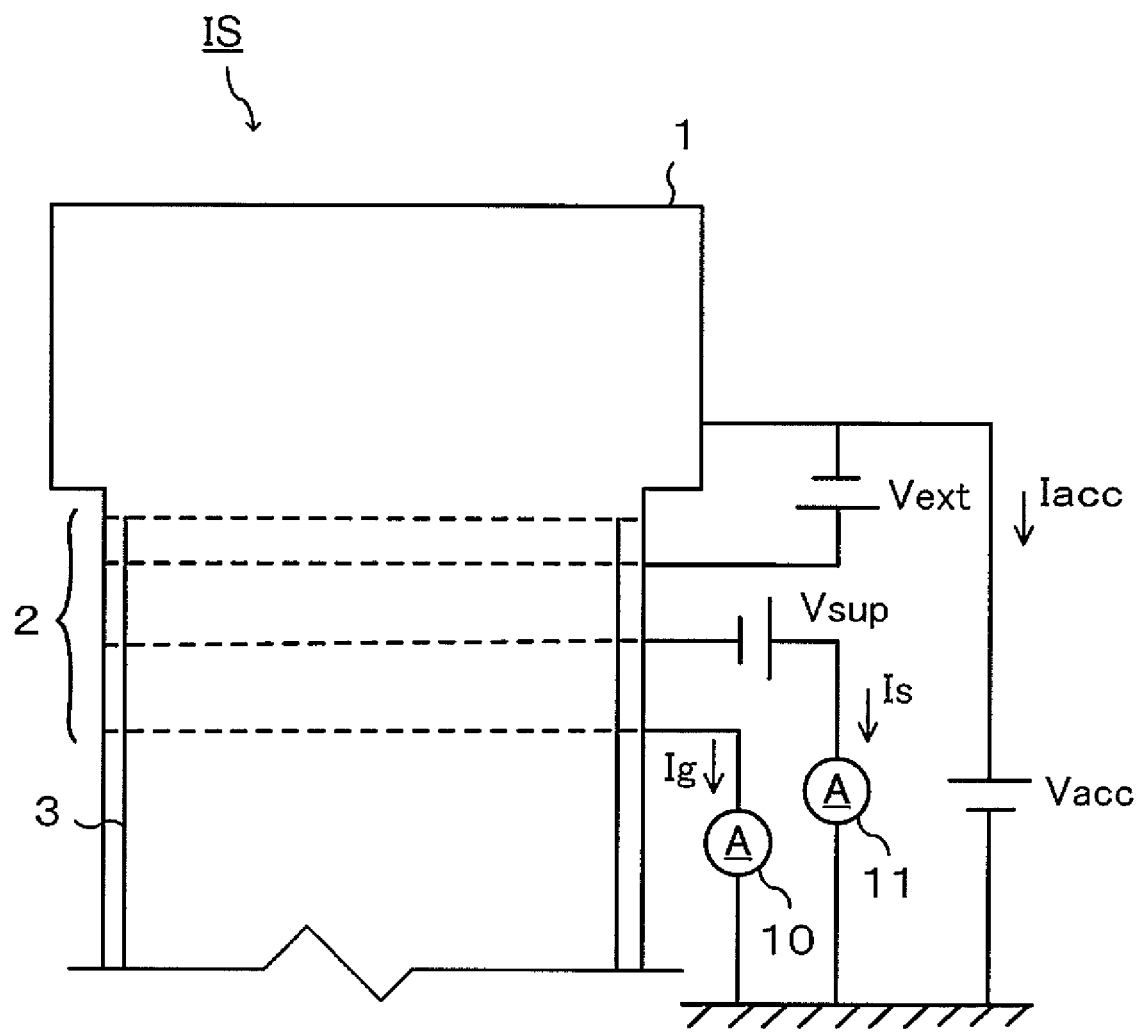
FIG. 4 is a schematic diagram illustrating an extraction electrode system, according to an exemplary embodiment.
Figure 5:
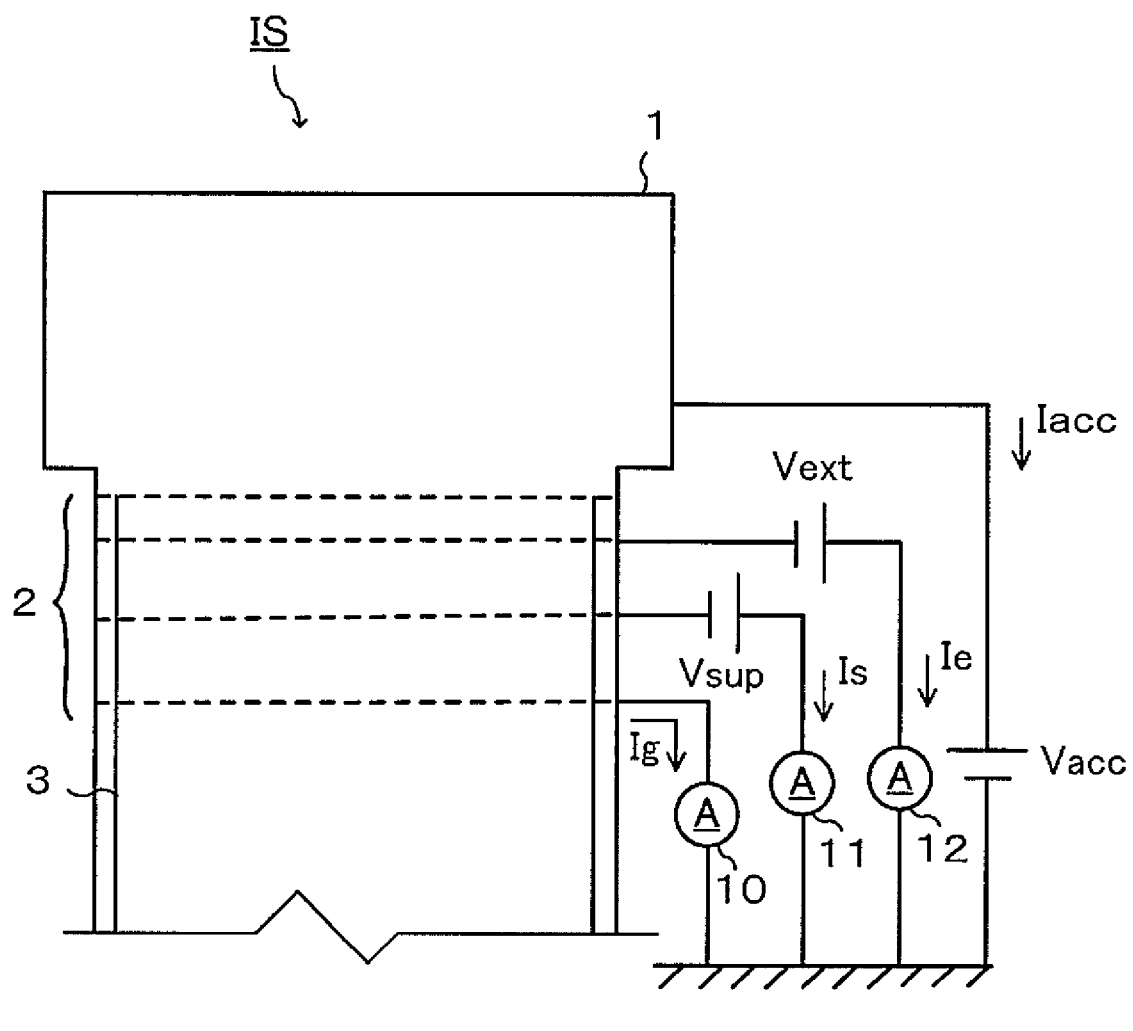
FIG. 5 is a schematic diagram illustrating an extraction electrode system, according to another exemplary embodiment.

This calculation technique will be described with reference to FIGS. 4 and 5. The configuration of the ion source IS has been described with reference to FIG. 1. However, the configuration shown in FIG. 1 is only an example, and the extraction electrode system 2 for extracting the ion beam 3 may have various configurations other than that illustrated in FIG. 1. Two examples thereof are depicted, respectively, in FIGS. 4 and 5, according to respective exemplary embodiments. As shown in FIGS. 4 and 5, a part of an ion beam 3 extracted from a plasma generation container 1 collides with electrodes constituting an extraction electrode system 2 in the course of passing through the extraction electrode system 2, and flows to the ground via power supplies connected to the respective electrodes.

A power supply is connected between the plasma generation container 1 and the ground. Ideally, a current corresponding to an applied voltage from this power supply is extracted through the extraction electrode system 2 as the ion beam 3. However, a part of the ion beam 3 collides with the electrodes, as mentioned above. In view of this collision, a current flowing to the ground due to the collision between a part of the ion beam 3 and the electrodes is measured, and a beam current of the ion beam 3 to be extracted through the extraction electrode system 2 is calculated by subtracting the measured value from an ideal beam current value (i.e., a beam current calculated on an assumption that the ion beam 3 does not collide with the electrodes).

A beam current calculated as the ion beam 3 to be extracted through the extraction electrode system 2 may be referred to as "extraction current". A value of the extraction current may be compared with a reference value to switch between the first and second ion implantation treatment modes, depending on a result of the comparison.

The above configuration will be specifically described below. For measurement of a beam current flowing to the ground, a first ammeter 10, a second ammeter 11 and a third ammeter 12 illustrated in FIGS. 4 and 5 are used. Based on current values Ig, Is, Ie measured by the first to third ammeters, respectively, and an ideal beam current value Iacc, the calculation of the beam current of the ion beam 3 to be extracted through the extraction electrode system 2 (extraction current) is performed.

A formula for calculating the extraction current in each illustrated configuration will be described. In the configuration illustrated in FIG. 4, the extraction current=Iacc−(Ig+Is). In the configuration illustrated in FIG. 5, the extraction current=Iacc−(Ig+Is+Ie). A beam current calculation system described here comprises the ammeters connected to the respective electrodes, and the control device 9 illustrated in FIG. 1. Alternatively, in some exemplary embodiments, an additional control device other than the control device 9 may be provided, and configured to fulfill a function of calculating the beam current.

In the first ion implantation treatment mode, when the substrate 5 is disposed at the position non-irradiated with the ion beam 3, the ion beam 3 is partially shielded by the support member 6. In the case where the beam current largely fluctuates in a part of the ion beam 3 shielded by the support member 6, this fluctuation cannot be detected by using the measuring device 7. In contrast, calculating the beam current of the ion beam 3 to be extracted through the extraction electrode system 2 makes it possible to know a fluctuation in beam current of the entire ion beam and appropriately switch between the first and second ion implantation treatment modes.

Alternatively, in some exemplary embodiments, the first ion implantation treatment mode and the second ion implantation treatment mode may be performed in the following manner. During the entire ion implantation treatment for the substrate 5, the ion implantation treatment process is performed in the second ion implantation treatment mode at least two times. Further, the ion implantation treatment process is performed in the first ion implantation treatment mode at least one time between consecutive ones of the second ion implantation treatment modes.

Figure 6:
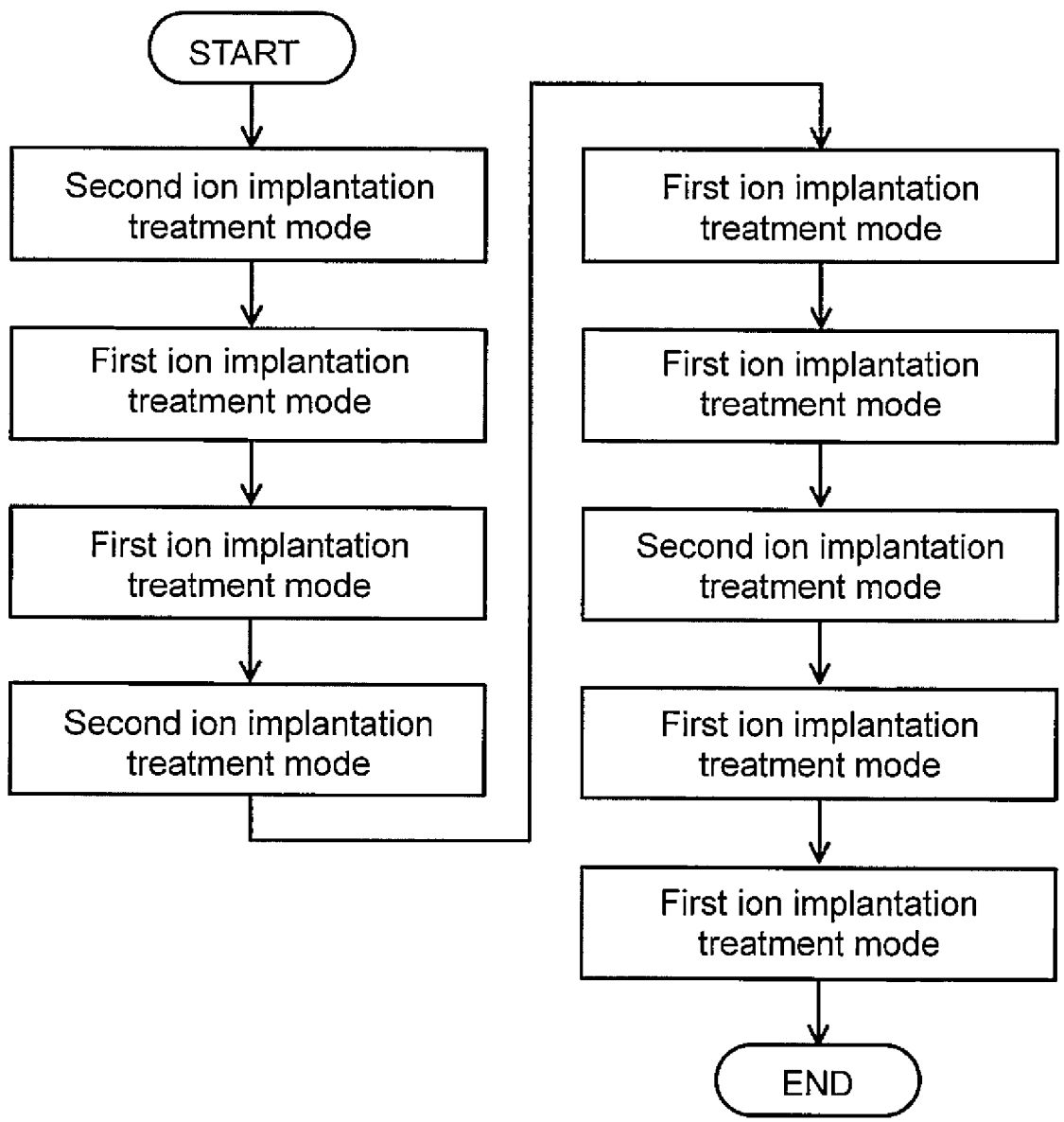
FIG. 6 is a flowchart illustrating an example of an ion implantation treatment method, according to an exemplary embodiment.

Specifically, this process can be expressed as a flowchart depicted in FIG. 6. In FIG. 6, the ion implantation treatment process is performed in the second ion implantation treatment mode one time, and then performed in the first ion implantation treatment mode two times. The state of the ion beam 3 is less likely to rapidly change during a period in which consecutive two ion implantation treatment processes are performed. Thus, in an ion implantation treatment process performed just after the state of the ion beam 3 is accurately checked in the second ion implantation treatment mode, it is not necessary to accurately check the state of the ion beam 3 again, except for exceptional circumstances. In view of this, the ion implantation apparatus is configured such that the ion implantation treatment process is performed in the second ion implantation treatment mode, and, after being performed in the first ion implantation treatment mode one or more times, performed in the second ion implantation treatment mode again. This use of two modes makes it possible to efficiently perform the ion implantation treatment.

Alternatively, in some exemplary embodiments, the first ion implantation treatment mode and the second ion implantation treatment mode may be performed in the following manner. During a period until a predetermined time elapses from start of the ion implantation treatment for the substrate 5, the ion implantation treatment processes are performed to allow the number of performances of the second ion implantation treatment mode to become greater than the number of performances of the first ion implantation treatment mode.

Figure 7:
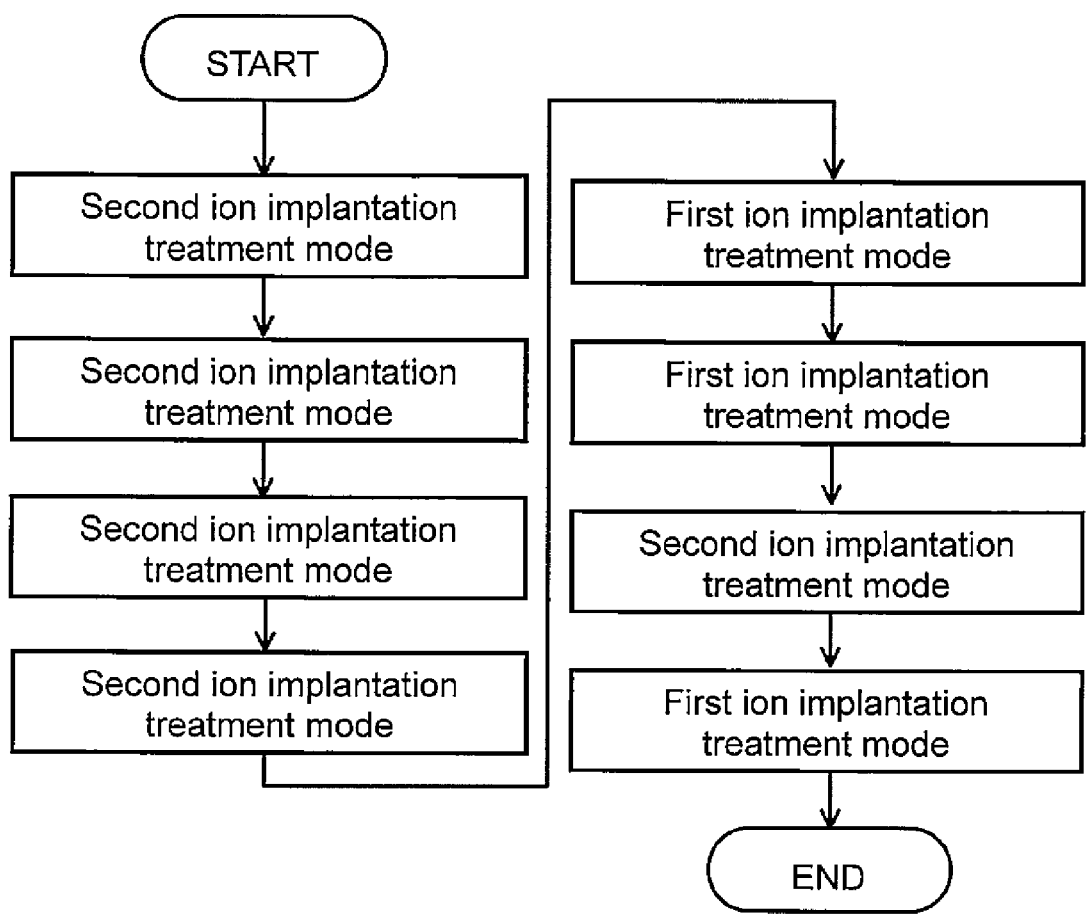
FIG. 7 is a flowchart illustrating an example of an ion implantation treatment method, according to another exemplary embodiment.

Specifically, this process can be expressed as a flowchart depicted in FIG. 7. In FIG. 7, during a period until the ion implantation treatment process is performed four times (e.g., during a period until a predetermined time elapses), the ion implantation treatment process is performed only in the second ion implantation treatment mode. Just after change in ion implantation treatment condition and just after activation of the apparatus in a stopped state, an operation state of the apparatus is apt to become unstable, and thereby the beam current of the ion beam 3 is more likely to largely fluctuate. Thus, the ion implantation apparatus is configured such that, during a period until the apparatus can stably operate, e.g., during a period until a predetermined time elapses from start of the ion implantation treatment for the substrate 5, the number of performances of the second ion implantation treatment mode becomes greater than the number of performances of the first ion implantation treatment mode to thereby allow the state of the ion beam irradiating the substrate to be accurately checked. The predetermined time may be obtained from previous experimental data or the like. Alternatively, in some exemplary embodiments, a plurality of predetermined times may be stored in the control device 9, and selectively used depending on an operation state of the apparatus or the like.

The measurement or calculation of the beam current of the ion beam 3 may be performed only in the second ion implantation treatment mode, without being performed in the first ion implantation treatment mode. When an implantation amount (dose) of ion to be implanted into the substrate 5 is compensated based on a beam current value obtained in the second ion implantation treatment mode, the following technique may be employed.

The following description will be made on an assumption that the ion implantation treatment is performed under the conditions presented in Table 1.

| Order | Task | Number of scans | Scan speed | Average beam | Implantation time | Target dose | Actual dose |
|---|---|---|---|---|---|---|---|
| 1 | Beam tuning | | | I1 | | | |
| 2 | Implantation | n1 | v1 | | t1 | Φ1 | Φ1 × (I1 + I1')/(2 × I1) |
| 3 | Beam check | | | I1' | | | |
| 4 | Beam tuning | | | I2 | | | |
| 5 | Implantation | n2 | v2 | | t2 | Φ2 | Φ2 × (I2 + I2')/(2 × I2) |
| 6 | Beam check | | | I2' | | | |
| 7 | Beam tuning | | | I3 | | | |
| 8 | Implantation (without compensation) | n3 | v3 | | t3 | Φ3 | |

Terms presented in Table 1 will be described below.

Task: a series of tasks to be performed in the implantation treatment.

Order: order of performance of the tasks.

Beam tuning: a task of adjusting parameters of an ion beam (In this task, a beam current value is primarily adjusted. For example, the beam tuning may be performed just before start of the ion implantation treatment and just after completion of the second ion implantation treatment mode.)

Implantation: a series of ion implantation treatment processes to be performed in the first and second ion implantation treatment modes.

Implantation (without compensation): a series of ion implantation treatment processes to be performed just after the last beam tuning. (In the aftermentioned description, various parameters are adjusted to perform dose compensation during this implantation. The number-of-scans n3, the scan speed v3, the average beam I3 and the dose Φ3 presented in Table 1 are parameters to be used when the dose compensation is not performed.)

Beam check: measurement or calculation of the beam current to be performed in the second ion implantation treatment mode.

Number of scans: the number of times of occurrence of a situation where the substrate comes across the ion beam.

Scan speed: a conveyance speed of the substrate when the substrate comes across the ion beam. Although the scan speed may vary from one implantation to another, the scan speed is maintained constant during each implantation.

Implantation time: a time taken for implantation.

Target dose: an intended dose.

Actual dose: an actual dose implanted into the substrate. Due to a fluctuation in the beam current, a difference between the target dose and the actual dose may occur.

Average beam: a result of averaging a beam current distribution of a ribbon-shaped ion beam in a longitudinal direction thereof.

Figure 8A:
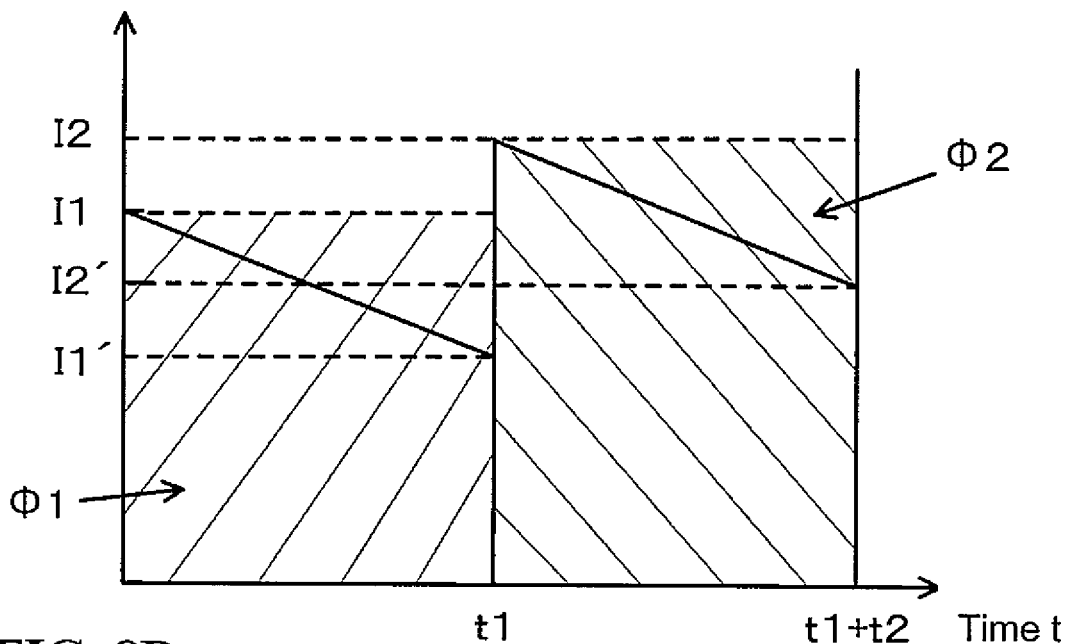
FIGS. 8A and 8B illustrate a relationship between a fluctuation in beam current and a dose.
Figure 8B:
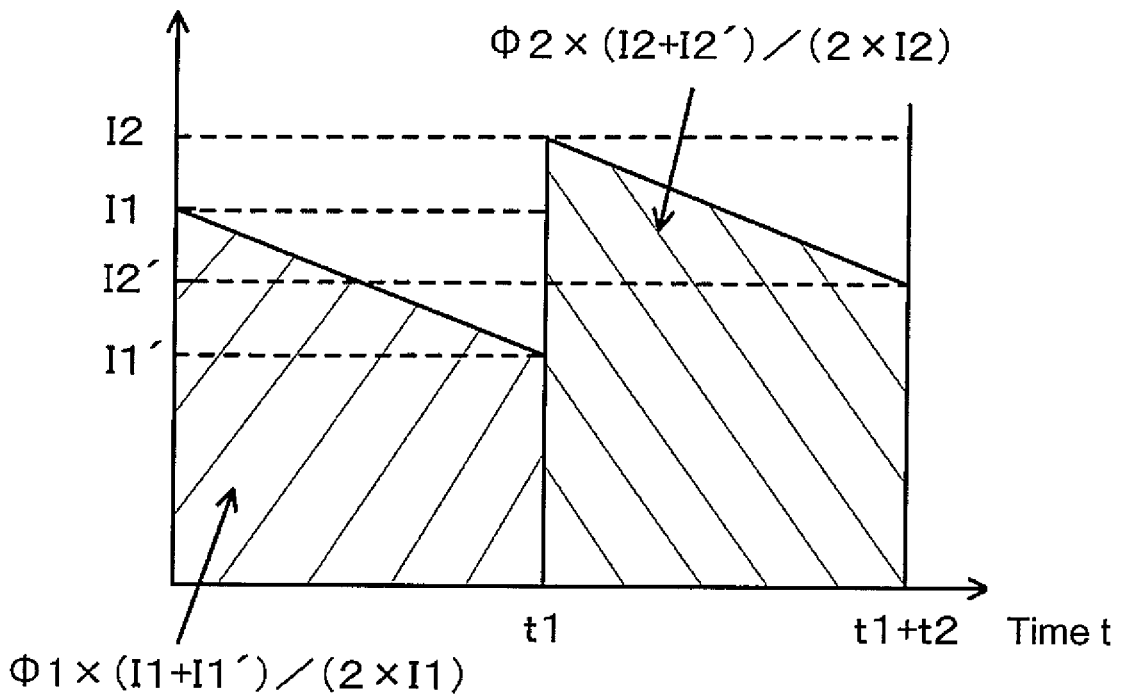

In the example presented in Table 1, the beam tuning is performed three times, and the beam check is performed two times. In an actual ion implantation treatment, the number of beam tunings and/or the number of beam checks may be changed depending on the situation. FIGS. 8A and 8B depict graphs each having a horizontal axis representing time and a vertical axis representing average beam current, and presenting a situation where a beam current of the ion beam 3 fluctuates during the ion implantation treatment. Although FIGS. 8A and 8B present an example in which the beam current decreases with time, the beam current can increase with time, in some cases. For example, when the filament F is worn, and a current flowing through the filament is controlled to become constant, the beam current may increase. It should be noted that, although FIG. 8(A) and FIG. 8(B) are the same graphs, they are prepared separately to clarify respective areas indicating the target dose and the actual dose. Based on FIGS. 8A and 8B and Table 1, a specific dose compensation technique will be described below.

The dose varies in proportion to each of the beam current and the number of scans, and in inverse proportion to the scan speed. On an assumption that a proportionality constant is k, the target dose Φ1 and the target dose Φ2 can be expressed, respectively, as Formula 1 and Formula 2.

$$\Phi 1 = k \times I1 \times n1/v1 \qquad \text{<Formula 1>}$$

$$\Phi 2 = k \times I2 \times n2/v2 \qquad \text{<Formula 2>}$$

In the case where the beam current does not fluctuate, ions are implanted into the substrate 5 in each implantation, based on Formula 1 or Formula 2. However, in reality, the beam current fluctuates. Thus, as is evident from comparison between FIGS. 8A and 8B, the target dose and the actual dose are not identical to each other.

On an assumption that an actual dose in the first implantation presented in Table 1 is Φ1R, and an actual dose in the second implantation presented in Table 1 is Φ2R, Φ1R and Φ2R can be expressed, respectively, as Formula 3 and Formula 4. During a period until the first beam check is performed after start of the ion implantation treatment, and during a period until the second beam check is performed after completion of the first beam check, the measurement or calculation of the beam current is not performed, so that it is unknown in what manner the beam current fluctuates. In Formulas 3 and 4, suppose that the beam current linearly changes during the period where the measurement or calculation of the beam current is not performed.

$$\Phi 1R = \Phi 1 \times (I1' \times t1 + (I1 - I1') \times t1/t2)/(I1 \times t1) \qquad \text{<Formula 3>}$$
$$= \Phi 1 \times (I1 + I1')/(2 \times I1)$$

$$\Phi 2R = \Phi 2 \times (I2' \times t2 + (I2 - I2') \times t1/t2)/(I2 \times t1) \qquad \text{<Formula 4>}$$
$$= \Phi 2 \times (I2 + I2')/(2 \times I2)$$

The dose is proportional to each of the beam current and the number of scans, and inversely proportional to the scan speed, as mentioned above. Thus, the dose compensation can be performed by adjusting these parameters.

First of all, a technique of performing the dose compensation by adjusting the scan speed will be discussed. In the case where no dose compensation is performed, v3 is expressed as the following Formula 5. In Formula 5, Φ denotes a final target dose, and is expressed as follows: Φ=Φ1+Φ2+Φ3.

$$v3 = k \times I3 \times n3/\Phi 3 \qquad \text{<Formula 5>}$$
$$= k \times I3 \times n3/(\Phi - (\Phi 1 + \Phi 2))$$

In the case where the scan speed is adjusted while taking into account the actual dose, the adjusted scan speed is expressed as the following Formula 6. In Formula 6, v3C denotes the adjusted scan speed.

$$v3C = k \times I3 \times n3/(\Phi - (\Phi 1R + \Phi 2R)) \qquad \text{<Formula 6>}$$

The last implantation presented in Table 1 may be performed using the scan speed v3C. In this case, it becomes possible to perform the dose compensation.

Next, a technique of performing the dose compensation by adjusting the beam current will be discussed. In the case where no dose compensation is performed, I3 is expressed as the following Formula 7.

$$I3 = v3 \times \Phi 3/(k \times n3) \qquad \text{<Formula 7>}$$
$$= v3 \times (\Phi - (\Phi 1 + \Phi 2))/(k \times n3)$$

In the case where the beam current I3 is adjusted while taking into account the actual dose as with the adjustment of the scan speed, the adjusted beam current is expressed as the following Formula 8. In Formula 8, I3C denotes the adjusted beam current.

$$I3C = v3 \times (\Phi - (\Phi 1R + \Phi 2R))/(k \times n3) \qquad \text{<Formula 8>}$$

The last implantation presented in Table 1 may be performed using the beam current I3C. In this case, it becomes possible to perform the dose compensation.

While examples of the technique of performing the dose compensation by adjusting the scan speed or the beam current have been described, the technique involves the following disadvantages.

In the case of adjusting the scan speed, due to mechanical restrictions of the drive mechanism, the scan speed has a maximum scan speed vmax and a minimum scan speed vmin. Thus, it may not be possible to set the adjusted scan speed v3C in Formula 6 to a value greater than the maximum scan speed vmax. It may also not be possible to set the adjusted scan speed v3C to a value less than the minimum scan speed vmin.

In these situations, in addition to the adjustment of the scan speed, the number of scans may be adjustably increased or reduced to allow the adjusted scan speed v3C to fall within the range between the minimum scan speed vmin and the maximum scan speed vmax. The use of this technique of adjusting the scan speed and the number of scans makes it possible to realize desired dose compensation.

In the case of adjusting the beam current, due to structural restrictions, the beam current also has a maximum beam current Imax and a minimum beam current Imin. Thus, as with the adjustment of the scan speed, in a situation where the adjusted beam current I3C in Formula 8 does not fall within the range between the maximum beam current Imax and the minimum beam current Imin, the number of scans may be adjustably increased or reduced, in addition to the adjustment of the beam current, to allow the adjusted beam current I3C to fall within the range between the maximum beam current Imax and the minimum beam current Imin. The use of this technique of adjusting the beam current and the number of scans makes it possible to realize desired dose compensation.

<Other Modifications>

The conveyance direction of the substrate 5 is not limited to the X-axis direction, but may be any direction, as long as the direction intersects the Z-axis direction, i.e., the traveling direction of the ion beam 3, and allows the entire surface of the substrate 5 to be irradiated with the ion beams 3 according to the conveyance of the substrate 5.

In some exemplary embodiments, the number of the substrates 5 to be supported by the support member 6 is one. Alternatively, in other exemplary embodiments, the number of the substrates 5 may be two or more. Further, in some exemplary embodiments, the number of the support members 6 is one. However, in other exemplary embodiments, the number of the support members 6 may be two or more. In the case where the number of support members 6 is two or more, it is conceivable to support one or more substrates 5 by each of the support members 6, and convey the support members 6 by turns so as to subject the one or more substrates 5 to ion implantation.

The above exemplary embodiments have been described by taking an ion implantation apparatus as an example of an ion irradiation apparatus. However, the ion irradiation apparatus is not limited to an ion implantation apparatus. For example, the present inventive concept may be applied to any ion irradiation apparatus, such as, for example, an ion milling apparatus, or a surface modification apparatus, or any other apparatus that uses an ion beam.

As described above, according to one or more exemplary embodiments, an ion irradiation apparatus comprises a support member having an outside dimension greater than an outside dimension of a substrate in a conveyance direction of the substrate, wherein the support member being configured to be conveyed together with the substrate while supporting the substrate by an inward region of the support member in the conveyance direction; and a measuring device disposed forwardly in a traveling direction of an ion beam with respect to a position where the substrate is conveyed within a treatment chamber, wherein the measuring device being configured to be irradiated with at least a part of the ion beam, when the substrate is at a position non-irradiated with the ion beam, wherein the ion irradiation apparatus is configured to perform an ion irradiation treatment process of conveying the substrate within the treatment chamber in a direction intersecting the ion beam traveling direction to irradiate the substrate with the ion beam, plural times, to complete an ion irradiation treatment for the substrate, and wherein the ion irradiation treatment process has: a first ion irradiation treatment mode during which the measuring device is irradiated with a remaining part of the ion beam after being partially shielded by the support member, when the substrate is disposed at the position non-irradiated with the ion beam; and a second ion irradiation treatment mode during which the measuring device is irradiated with the ion beam without being shielded by the support member, when the substrate is disposed at the position non-irradiated with the ion beam, and wherein the ion irradiation apparatus further comprises a control device configured to control the conveyance of the substrate in such a manner that the ion irradiation treatment process is performed in the first ion irradiation treatment mode at least one time during a period until the ion irradiation treatment for the substrate is completed.

During generation of an electrical discharge and during start-up of the apparatus, a beam current of the ion beam largely fluctuates on a short-term basis. On the other hand, in the case where a fluctuation in the beam current is caused by wear of a member such as a filament for generating plasma serving as a source of the ion beam, it occurs only on a long-term basis. Considering the above, the ion irradiation apparatus is configured to perform the ion irradiation treatment process, a plurality of times, during a period until the ion irradiation treatment for the substrate is completed, wherein the ion irradiation treatment process is performed in the first ion irradiation treatment mode at least one time.

As compared to the second ion irradiation treatment mode, the first ion irradiation treatment mode becomes shorter in terms of a conveying distance of a substrate. Thus, the above configuration makes it possible to shorten a total time for the ion irradiation treatment, as compared to the case where the ion irradiation treatment process is performed only in the second ion irradiation treatment mode each time. Further, in each of the first and second ion irradiation treatment modes, the measuring device is irradiated with at least a part of the ion beam, so that it becomes possible to check the state of the ion beam during the ion irradiation treatment.

In the ion irradiation apparatus, the control device may be configured to control the conveyance of the substrate depending on a fluctuation in beam current of the ion beam to switch between the first ion irradiation treatment mode and the second ion irradiation treatment mode.

This configuration of the ion irradiation apparatus may be used to perform a treatment. When a large fluctuation occurs in beam current of the ion beam for use in the irradiation treatment, an error is likely to occur in a subsequent ion irradiation treatment process. Therefore, the ion irradiation apparatus is configured such that, when the beam current largely fluctuates, a subsequent ion irradiation treatment process is performed in the second ion irradiation treatment mode. This configuration makes it possible to accurately figure out a current state of the ion beam and perform an appropriate correction in a subsequent ion irradiation treatment process. On the other hand, if almost no fluctuation occurs in beam current of the ion beam, it is not necessary to accurately figure out the state of the ion beam irradiating the substrate. Thus, in this situation, a subsequent ion irradiation treatment process may be performed in the first ion irradiation treatment mode.

Specific switching between the first and second ion irradiation treatment modes may be performed as follows. The ion irradiation apparatus may further comprise an ion source having an extraction electrode system composed of a group of electrodes; and a beam current calculation system configured to measure a current flowing through the electrodes constituting the extraction electrode system, and, based on a result of the measurement, calculate a beam current of the ion beam to be extracted through the extraction electrode system, wherein the control device is configured to switch between the first ion irradiation treatment mode and the second ion irradiation treatment mode, depending on a result of the calculation by the beam current calculation system.

In the first ion irradiation treatment mode, when the substrate is disposed at the position non-irradiated with the ion beam, the ion beam is partially shielded by the support member. In the case where the beam current largely fluctuates in a part of the ion beam shielded by the support member, such a fluctuation in the beam current cannot be detected by using the measuring device because the measuring device is not irradiated with the part of the ion beam. In contrast, calculating the beam current of the ion beam to be extracted through the extraction electrode system makes it possible to know a fluctuation in beam current of the entire ion beam irradiating the substrate. Therefore, the use of the above configuration makes it possible to appropriately switch between the first ion irradiation treatment mode and the second ion irradiation treatment mode.

In the ion irradiation apparatus, the control device may be configured to control the conveyance of the substrate in such a manner that the ion irradiation treatment process is performed in the second ion irradiation treatment mode at least two times, and performed in the first ion irradiation treatment mode at least one time between intervals of the second ion irradiation treatment mode.

The state of the ion beam is less likely to rapidly change during a period in which consecutive two ion irradiation treatment processes are performed. In an ion irradiation treatment process performed just after the state of the ion beam is accurately checked in the second ion irradiation treatment mode, it is not necessary to accurately check the state of the ion beam again, except for exceptional circumstances. In view of this, the ion irradiation apparatus may be configured such that the ion irradiation treatment process is performed in the second ion irradiation treatment mode, and, after being performed in the first ion irradiation treatment mode one or more times, performed in the second ion irradiation treatment mode again. This makes it possible to efficiently perform the ion radiation treatment.

In the ion irradiation apparatus, the control device may be configured to control the conveyance of the substrate in such a manner that the number of performances of the second ion irradiation treatment mode becomes greater than the number of performances of the first ion irradiation treatment mode, during a period until a predetermined time elapses from start of the ion irradiation treatment for the substrate.

Just after change in ion irradiation treatment condition and just after activation of the apparatus in a stopped state, an operation state of the apparatus is apt to become unstable, and thereby the beam current of the ion beam is more likely to largely fluctuate. Thus, the ion irradiation apparatus may be configured such that, during a period until the apparatus can stably operate, e.g., during a period until a predetermined time elapses from start of the ion irradiation treatment for the substrate, the number of performances of the second ion irradiation treatment mode becomes greater than the number of performances of the first ion irradiation treatment mode to thereby allow the state of the ion beam irradiating the substrate to be accurately checked.

As described above, according to one or more exemplary embodiments, an ion irradiation method comprises providing a support member having an outside dimension greater than an outside dimension of a substrate in a conveyance direction of the substrate, and a measuring device disposed forwardly in a traveling direction of an ion beam with respect to a position where the substrate is conveyed within a treatment chamber, wherein the support member is configured to be conveyed together with the substrate while supporting the substrate by an inward region of the support member in the conveyance direction, and the measuring device is configured to be irradiated with at least a part of the ion beam, when the substrate is at a position non-irradiated with the ion beam; performing an ion irradiation treatment process of conveying the substrate within the treatment chamber in a direction intersecting the ion beam traveling direction to irradiate the substrate with the ion beam, plural times, to complete an ion irradiation treatment for the substrate, wherein the ion irradiation treatment process has: a first ion irradiation treatment mode during which the measuring device is irradiated with a remaining part of the ion beam after being partially shielded by the support member, when the substrate is disposed at the position non-irradiated with the ion beam; and a second ion irradiation treatment mode during which the measuring device is irradiated with the ion beam without being shielded by the support member, when the substrate is disposed at the position non-irradiated with the ion beam; and conveying the substrate in such a manner that the ion irradiation treatment process is performed in the first ion irradiation treatment mode at least one time during a period until the ion irradiation treatment for the substrate is completed.

During generation of an electrical discharge and during start-up of the apparatus, a beam current of the ion beam largely fluctuates on a short-term basis. On the other hand, in the case where a fluctuation in the beam current is caused by wear of a member such as a filament for generating plasma serving as a source of the ion beam, it occurs only on a long-term basis. Considering the above, the ion irradiation apparatus may be configured to perform the ion irradiation treatment process, plural times, during a period until the ion irradiation treatment for the substrate is completed, wherein the ion irradiation treatment process is performed in the first ion irradiation treatment mode at least one time. Thus, it becomes possible to shorten a total time for the ion irradiation treatment, as compared to the case where the ion irradiation treatment process is performed only in the second ion irradiation treatment mode each time. Further, in each of the first and second ion irradiation treatment modes, the measuring device is irradiated with at least a part of the ion beam, so that it becomes possible to check the state of the ion beam during the ion irradiation treatment.

It is to be understood that various other changes and modifications may be made to the above-described exemplary embodiments without departing from the spirit and scope of the present inventive concept as set forth in appended claims.

What is claimed is:

1. An ion irradiation apparatus comprising:
a support member having an outside dimension greater than an outside dimension of a substrate in a conveyance direction of the substrate, the support member being configured to be conveyed together with the substrate while supporting the substrate by an inward region of the support member in the conveyance direction; and
a measuring device disposed forwardly in a traveling direction of an ion beam with respect to a position where the substrate is conveyed within a treatment chamber, the measuring device being configured to be irradiated with at least a part of the ion beam, when the substrate is at a position in which the substrate is not irradiated with the ion beam,
wherein the ion irradiation apparatus is configured to perform an ion irradiation treatment process of conveying the substrate within the treatment chamber in a direction intersecting the ion beam traveling direction so that the substrate is irradiated with the ion beam, a plurality of times, to complete an ion irradiation treatment for the substrate,
wherein the ion irradiation treatment process comprises:
a first ion irradiation treatment mode during which the measuring device is irradiated with a remaining part of the ion beam after being partially shielded by the support member, when the substrate is disposed at the position in which the substrate is not irradiated with the ion beam after crossing the ion beam; and
a second ion irradiation treatment mode during which the measuring device is irradiated with the ion beam without being shielded by the support member, when the substrate is disposed at the position in which the substrate is not irradiated with the ion beam after crossing the ion beam, and
wherein the ion irradiation apparatus further comprises a control device configured to control the conveyance of the substrate in such a manner that the ion irradiation treatment process is performed in the first ion irradiation treatment mode at least one time during a period until the ion irradiation treatment for the substrate is completed.

2. The ion irradiation apparatus of claim 1, wherein the control device is configured to control the conveyance of the substrate depending on a fluctuation in beam current of the ion beam to switch between the first ion irradiation treatment mode and the second ion irradiation treatment mode.

3. The ion irradiation apparatus of claim 1, further comprising:
an ion source having an extraction electrode system comprising a plurality of electrodes; and
a beam current calculation system configured to measure a current flowing through the electrodes of the extraction electrode system, and, based on a result of the measurement, calculate a beam current of the ion beam to be extracted through the extraction electrode system, wherein the control device is configured to switch between the first ion irradiation treatment mode and the second ion irradiation treatment mode, depending on a result of the calculation by the beam current calculation system.

4. The ion irradiation apparatus of claim 1, wherein the control device is configured to control the conveyance of the substrate in such a manner that the ion irradiation treatment process is performed in the second ion irradiation treatment mode at least two times, and performed in the first ion irradiation treatment mode at least one time between intervals of the second ion irradiation treatment mode.

5. The ion irradiation apparatus of claim 1, wherein the control device is configured to control the conveyance of the substrate in such a manner that the number of times the second ion irradiation treatment mode is performed becomes greater than the number of times the first ion irradiation treatment mode is performed, during a period until a predetermined time elapses from start of the ion irradiation treatment for the substrate.

6. An ion irradiation method comprising:
providing a support member having an outside dimension greater than an outside dimension of a substrate in a conveyance direction of the substrate, and a measuring device disposed forwardly in a traveling direction of an ion beam with respect to a position where the substrate is conveyed within a treatment chamber, wherein the support member is configured to be conveyed together with the substrate while supporting the substrate by an inward region of the support member in the conveyance direction, and the measuring device is configured to be irradiated with at least a part of the ion beam, when the substrate is at a position at which the substrate is not irradiated with the ion beam;
performing an ion irradiation treatment process of conveying the substrate within the treatment chamber in a direction intersecting the ion beam traveling direction to irradiate the substrate with the ion beam, a plurality of times, to complete an ion irradiation treatment for the substrate, wherein the ion irradiation treatment process comprises a first ion irradiation treatment mode during which the measuring device is irradiated with a remaining part of the ion beam after being partially shielded by the support member, when the substrate is disposed at the position at which the substrate is not irradiated with the ion beam after crossing the ion beam; and a second ion irradiation treatment mode during which the measuring device is irradiated with the ion beam without being shielded by the support member, when the substrate is disposed at the position at which the substrate is not irradiated with the ion beam after crossing the ion beam; and
conveying the substrate in such a manner that the ion irradiation treatment process is performed in the first ion irradiation treatment mode at least one time during a period until the ion irradiation treatment for the substrate is completed.

7. An ion irradiation apparatus comprising:
a support member having a substrate mounted thereon, an area of the support member in a plane orthogonal to a traveling direction of an ion beam being greater than an area of the substrate in the plane orthogonal to the traveling direction;
a measuring device that is disposed downstream of the support member in the traveling direction and that measures the ion beam; and
a control device configured to convey the support member in a direction intersecting the traveling direction to irradiate the substrate with the ion beam a plurality of times to perform an ion irradiation treatment on the substrate,
wherein the control device is configured to convey the support member, after crossing the ion beam, to a first position in which the substrate is not irradiated with the ion beam but the support member partially shields the measuring device from the ion beam, and to a second position in which the support member and the substrate are not irradiated by the ion beam and do not shield the measuring device from the ion beam, and
wherein the control device conveys the support member to the first position at least one time during the ion irradiation treatment.

8. The ion irradiation apparatus of claim 7, wherein, during the ion irradiation treatment, the measurement device measures a beam current of the ion beam, and the control device switches between the first position and the second position based on a fluctuation in the beam current of the ion beam measured by the measurement device.

9. The ion irradiation apparatus of claim 7, wherein, during the ion irradiation treatment, the control device conveys the support member to the second position a first time and a second time, and conveys the support member to the first position at least one time between the first time and the second time.

10. The ion irradiation apparatus of claim 7, wherein, during the ion irradiation treatment, the control device conveys the support member to the second position at least two times, and conveys the support member to the first position at least one time between intervals of conveying the support member to the second position.

11. The ion irradiation apparatus of claim 7, wherein the control device controls the support member such that the number of times the support member is conveyed to the second position is greater than the number of times the support member is conveyed to the first position, during a period from a start of the ion irradiation treatment until a predetermined time elapses.

* * * * *